US012745564B2

(12) United States Patent
Yang et al.

(10) Patent No.: US 12,745,564 B2
(45) Date of Patent: Sep. 22, 2026

(54) THIN FILM BASED STRUCTURES OF AN ELECTRONIC DEVICE AND A METHOD OF MAKING

(71) Applicant: City University of Hong Kong, Kowloon (HK)

(72) Inventors: Zhengbao Yang, Kowloon (HK); Shiyuan Liu, Kowloon (HK)

(73) Assignee: City University of Hong Kong, Kowloon (HK)

( * ) Notice: Subject to any disclaimer, the term of this patent is extended or adjusted under 35 U.S.C. 154(b) by 1003 days.

(21) Appl. No.: 18/049,352

(22) Filed: Oct. 25, 2022

(65) Prior Publication Data

US 2024/0138266 A1 Apr. 25, 2024
US 2024/0237537 A9 Jul. 11, 2024

(51) Int. Cl.
*H10N 30/081* (2023.01)

(52) U.S. Cl.
CPC .................................. *H10N 30/081* (2023.02)

(58) Field of Classification Search
CPC .. H10N 30/072; H10N 30/078; H10N 30/081; H10N 30/30; H10N 30/8536; H10N 30/8554
USPC ...................................... 29/25.35; 310/313 R
See application file for complete search history.

(56) References Cited

U.S. PATENT DOCUMENTS 11,758,816 B2 * 9/2023 Le Rhun .............. H10N 30/073 29/25.35
2004/0224482 A1 11/2004 Kub et al.
2015/0200350 A1 * 7/2015 Hajati .................. H10N 30/081 29/25.35
2023/0066205 A1 * 3/2023 Yang .................... H10N 30/078
2023/0216463 A1 * 7/2023 Nagata ...................... H03H 3/08 29/25.35

(Continued)

FOREIGN PATENT DOCUMENTS

CN 102795619 11/2012
CN 102795619 A * 11/2012
EP 1179861 A2 * 2/2002 ......... C23C 18/1216

(Continued)

OTHER PUBLICATIONS

Park, K.-I., Son, J. H., Hwang, G.-T., Jeong, C. K., Ryu, J., Koo, M., Choi, I., Lee, S. H., Byun, M., Wang, Z. L., & Lee, K. J. (2014). Highly-efficient, flexible piezoelectric PZT thin film nanogenerator on plastic substrates. Advanced Materials, 26(16), 2514-2520. https://doi.org/10.1002/adma.201305659.

(Continued)

*Primary Examiner* — Minh N Trinh
(74) *Attorney, Agent, or Firm* — Renner, Kenner, Greive, Bobak, Taylor & Weber

(57) ABSTRACT

A method of making a thin film based structure. The method includes (a): forming an electrically conductive layer on a substrate such that the electrically conductive layer is releasably attached to the substrate. The method also includes (b): forming a ceramic or metallic thin film on the electrically conductive layer, on a side opposite the substrate. The electrically conductive layer and the substrate are arranged such that when an interface between them contacts a water-based liquid, the water-based liquid facilitates or causes release of the electrically conductive layer from the substrate, substantially without damaging the substrate.

18 Claims, 10 Drawing Sheets

(56) References Cited

U.S. PATENT DOCUMENTS

2024/0138266 A1* 4/2024 Yang .................... H10N 30/081

FOREIGN PATENT DOCUMENTS

WO 2012161660 11/2012
WO 2011090010 4/2015

OTHER PUBLICATIONS

Dong, G., Li, S., Yao, M., Zhou, Z., Zhang, Y .- Q., Han, X., Luo, Z., Yao, J., Peng, B., Hu, Z., Huang, H., Jia, T., Li, J., Ren, W., Ye, Z.-G., Ding, X., Sun, J., Nan, C.-W., Chen, L.-Q., Li, Ju, Liu, M. (2019). Super-elastic ferroelectric single-crystal membrane with continuous electric dipole rotation. Science, 366(6464), 475-479. https://doi.org/10.1126/science.aay7221.

* cited by examiner

THIN FILM BASED STRUCTURES OF AN ELECTRONIC DEVICE AND A METHOD OF MAKING

TECHNICAL FIELD

The invention relates to thin film based structure, thin film structure, and their method of making and/or processing.

BACKGROUND

Flexible electronic devices such as electronic skins, implantable medical devices, and wearable smart systems are known. These flexible electronic devices can be made using, among other things, metal oxides such as piezoceramics.

Conventional bulk piezoceramics have relatively high energy conversion efficiency but are bulk and brittle hence not particularly suitable for use in making flexible electronic devices. On the other hand, piezoceramic thin films such as those with micro or nanoscale thickness are more flexible and can be used in making flexible electronic devices.

Piezoceramic thin films such as epitaxial growth derived piezoceramic thin films have exhibited dielectric, piezoelectric, and ferroelectric properties suitable for making flexible electronic devices. However, some existing methods for making epitaxial growth derived piezoceramic thin films can be complicated, costly, and/or not environmental friendly.

SUMMARY OF THE INVENTION

In a first aspect, there is provided a method of making a thin film based structure. The method includes (a): forming an electrically conductive layer on a substrate such that the electrically conductive layer is releasably attached to the substrate; and (b): forming a ceramic or metallic thin film on the electrically conductive layer, on a side opposite the substrate. The electrically conductive layer and the substrate are arranged (e.g., made with suitable material(s)) such that when an interface between them contacts a water-based liquid, the water-based liquid facilitates or causes release of the electrically conductive layer from the substrate, substantially without damaging (e.g., without substantially damaging) the substrate. The electrically conductive layer and the substrate are at least, or are only, bonded by van der Waals interaction. As a result, the released substrate can be re-used. The release of the electrically conductive layer from the substrate may involve the electrically conductive layer (along with at least one layer of material(s) attached to it, if any) moving relatively away from the substrate as the water-based solution penetrates the interface.

Optionally, the method further includes contacting the interface between the substrate and the electrically conductive layer with a water-based liquid to facilitate or cause release of the electrically conductive layer from the substrate, substantially without damaging the substrate.

Optionally, the method further includes (c): forming a support layer on the ceramic or metallic thin film, on a side opposite the electrically conductive layer.

Optionally, the method further includes (d): after (c), contacting an interface between the substrate and the electrically conductive layer with a water-based liquid to facilitate or cause release of the electrically conductive layer from the substrate, substantially without damaging the substrate, thereby forming a thin film structure.

Optionally, the substrate is made of mica. In one example, the mica is fluorophlogopite mica, e.g., $KMg_3(AlSi_3O_{10})F_2$. For example, the substrate may be made of one or more mica sheets.

The electrically conductive layer is made of one or more electrically conductive materials. Optionally, the electrically conductive layer is made of one or more metallic materials. For example, the one or more metallic material includes or consists of (i.e., consists only of) platinum. Optionally, the electrically conductive layer includes or consists of a metallic layer such as a platinum layer.

Optionally, (a) includes depositing or coating the electrically conductive layer on the substrate. Optionally, the depositing or coating is performed using magnetron sputtering technique.

The ceramic or metallic thin film is made of one or more ceramic materials and/or one or more metallic materials.

Optionally, the ceramic or metallic thin film includes or consists of a metallic layer made of one or more metallic materials. The one or more metallic materials may comprise or consist of platinum, gold, silver, etc.

Optionally, the ceramic or metallic thin film includes or consists of a ceramic layer made of one or more ceramic materials. Optionally, the ceramic layer includes or consists of a piezoceramic layer, and the one or more ceramic materials comprise or consist of one or more piezoceramic materials. Optionally, the one or more piezoceramic materials comprise a sol-gel-derived ceramic material. For example, the sol-gel-derived ceramic material may comprise or consist of BCZT ($Ba_{0.85}Ca_{0.15}Zr_{0.1}Ti_{0.9}O_3$), barium titanate (BTO) (e.g., $BaTiO_3$), lead zirconate titanate (PZT) (e.g., $Ph[Zr_xTi_{1-x}]O_3$ where $0 \leq x \leq 1$), or any of their combination.

Optionally, (b) includes or consists of (b1): depositing a sol (a more liquid state of a colloidal solution) on the electrically conductive layer, on the side opposite the substrate; (b2): converting the sol deposited on the electrically conductive layer into a gel (a more solid (solid or semi-solid) state of the colloidal solution); and (b3): crystalizing the gel to form a layer of thin film. The ceramic or metallic thin film includes or consists of the layer of thin film.

Optionally, (b1) includes spin-coating the sol on the electrically conductive layer, on the side opposite the substrate. The thickness of the sol deposited on the electrically conductive layer depends on, e.g., spin speed of the spin-coating process, concentration of the sol, etc.

Optionally, (b2) includes drying the sol to form the gel. For example, the drying may be performed by directly or indirectly heating or applying heat to the sol.

Optionally, (b3) includes annealing the gel to sinter the gel. The annealing may be include directly or indirectly heating or applying heat to the gel. For example, the annealing includes heating the gel at an elevated temperature for a predetermined period of time, to transform the gel into ceramic crystals or a ceramic crystal structure. In one example, for sintering of BCZT, the annealing is performed at 800 degree Celsius for 30 minutes.

Optionally, (b) includes: repeating (b1), (b2), and (b3) at least once to form at least two layers of thin film on the electrically conductive layer, the at least two layers of thin film includes the layer of thin film. The ceramic or metallic thin film comprises the at least two layers of thin film. The at least two layers of thin film are arranged in a stack. Different layers of thin film may have the same or different cross sectional shape and/or size and/or thickness.

Optionally, the water-based liquid consists of water. Optionally, the water-based liquid comprises or consists of water with surfactant(s).

Optionally, the thin film structure has a thickness or average thickness in an order of microns. For example, the thin film structure has a thickness or average thickness in a range of about 0.1 lam to about 5 μm.

Optionally, the ceramic or metallic thin film, or the thin film structure, has a surface area in an order of square centimeters or square millimeters. For example, the ceramic or metallic thin film, or the thin film structure, has a surface area of about 2 cm×2 cm.

(d) may include causing the substrate and/or the electrically conductive layer to come into contact with the water-based liquid, or (d) may include causing the water-based liquid to come into contact with the substrate and/or the electrically conductive layer.

Optionally, (c) comprises: (c1): depositing or coating the support layer on the ceramic or metallic thin film. Optionally, (c1) comprises spin-coating a polymer solution on the ceramic or metallic thin film to form the support layer.

Optionally, the support layer is elastic. Optionally, the support layer is made of one or more polymer materials. Optionally, the support layer can be chemically dissolved and/or thermally decomposed. For example, the support layer can be made of one or more of: ethylene-vinyl acetate (EVA), polyvinylidene fluoride (PVDF), polystyrene, poly (methyl methacrylate) (PMMA), etc.

Optionally, the method further comprises: after (d), using the substrate to form another thin film structure. Specifically, the method may include: (e): after (d), forming an electrically conductive layer on the substrate such that the electrically conductive layer is releasably attached to the substrate; (f): forming a ceramic or metallic thin film on the electrically conductive layer formed in (e), on a side opposite the substrate; (g): forming a support layer on the ceramic or metallic thin film formed in (f), on a side opposite the electrically conductive layer; and (h): after (g), contacting an interface between the substrate and the electrically conductive layer in (e) with a water-based liquid to facilitate or cause release of the electrically conductive layer in (e) from the substrate, substantially without damaging the substrate, thereby forming another thin film structure. The structure of this another thin film structure and the structure of the thin film structure may be the same or different.

In a second aspect, there is provided a thin film based structure formed directly or indirectly from the method in the first aspect. The thin film based structure includes, at least: the substrate, the electrically conductive layer releasably attached to the substrate, the ceramic or metallic thin film attached to the electrically conductive layer on the side opposite the substrate, and the support layer arranged on the ceramic or metallic thin film on the side opposite the electrically conductive layer. The thin film based structure can be used for forming the thin film structure in the first aspect. Some embodiments of the thin film based structure in the second aspect may include one or more optional features of the first aspect.

In a third aspect, there is provided a thin film structure obtained directly or indirectly from the method in the first aspect. The thin film structure includes, at least: the electrically conductive layer; the ceramic or metallic thin film attached to the electrically conductive layer; and the support layer arranged on the ceramic or metallic thin film on the side opposite the electrically conductive layer. Some embodiments of the thin film structure in the third aspect may include one or more optional features of the first aspect.

In a fourth aspect, there is provided a method for processing the thin film structure obtained directly or indirectly from the method in the first aspect, or for processing the thin film structure in the third aspect. The method includes: attaching the electrically conductive layer of the thin film structure to a target substrate; and after the thin film structure is attached to the target substrate, removing the support layer from the thin film structure. The substrate in the first aspect is made of a first material (which includes one or more materials) and the target substrate is made of a second material (which includes one or more materials) different from the first material.

Optionally, the target substrate is made of one or more electrically insulating materials. Optionally, the target substrate is made of one or more polymer materials. For example, the target substrate may be made of one or more of: polydimethylsiloxane (PDMS), polyethylene terephthalate (PET), polyimide (PI), etc. Optionally, the target substrate comprises or consists of a PDMS layer. Optionally, the target substrate comprises or consists of a PET layer. Optionally, the target substrate comprises or consists of a PI layer. Optionally, the target substrate is flexible (e.g., stretchable, bendable, etc.).

Optionally, removing the support layer comprises chemically dissolving and/or thermally decomposing the support layer.

Optionally, the chemically dissolved and/or thermally decomposed support layer material(s) can be used for forming a support layer of another thin film structure. The structure of the another thin film structure and the structure of the thin film structure may be the same or different.

Optionally, the electrically conductive layer is a first electrically conductive layer, and the method further includes: after the support layer is removed from the thin film structure, arranging a second electrically conductive layer on the ceramic or metallic thin film, on a side opposite the first electrically conductive layer, such that the ceramic or metallic thin film is arranged between the first electrically conductive layer and the second electrically conductive layer. This forms a flexible thin film based device.

The second electrically conductive layer is made of one or more electrically conductive materials. Optionally, the second electrically conductive layer is made of one or more metallic materials. For example, the one or more metallic material includes or consists of (i.e., consists only of) platinum. Optionally, the second electrically conductive layer includes or consists of a metallic layer such as a platinum layer.

Optionally, the first electrically conductive layer and the second electrically conductive layer are of substantially the same cross-sectional shape and/or size. Optionally, the first electrically conductive layer and the second electrically conductive layer are made of the same material or materials.

Optionally, the method further comprises: arranging a backing layer on the second electrically conductive layer, on a side opposite the ceramic or metallic thin film. Optionally, the backing layer is a cover layer.

Optionally, the backing layer is made of one or more electrically insulating materials. Optionally, the backing layer is made of one or more polymer materials. For example, the backing layer may be made of one or more of: polydimethylsiloxane (PDMS), polyethylene terephthalate (PET), polyimide (PI), etc. Optionally, the backing layer comprises or consists of a PDMS layer. Optionally, the backing layer comprises or consists of a PET layer. Optionally, the backing layer comprises or consists of a PI layer. Optionally, the backing layer is flexible (e.g., stretchable, bendable, etc.). Optionally, the backing layer and the target substrate are made of the same material or materials. Optionally, the backing layer is generally planar with a first thickness, and the target substrate is generally planar with a second thickness larger than the first thickness.

In a fifth aspect, there is provided a flexible thin film based device formed directly or indirectly from the method of the fourth aspect. The flexible thin film based device includes: the target substrate, the electrically conductive layer attached to the target substrate, the ceramic or metallic thin film attached to the electrically conductive layer on a side opposite the target substrate; and the second electrically conductive layer arranged on the ceramic or metallic thin film on a side opposite the electrically conductive layer. The flexible thin film based device may be portable, wearable, etc. The flexible thin film based device may be stretchable, bendable, etc.

Optionally, the flexible thin film based device also includes the backing layer arranged on the second electrically conductive layer on a side opposite the ceramic or metallic thin film.

Optionally, the ceramic or metallic thin film comprises a piezoceramic thin film, and the flexible thin film based device is a piezoelectric device. The piezoelectric device may be a piezoelectric sensor, a piezoelectric energy harvester (e.g., a piezoelectric generator or nanogenerator), etc.

In a sixth aspect, there is provided an electrical device including the flexible thin film based device of the fifth aspect.

In a seventh aspect, there is provided a method for making and processing a thin film structure including the method of the first aspect and the method of the fourth aspect.

In an eighth aspect, there is provided a method for making a flexible thin film based device including the method of the first aspect and the method of the fourth aspect.

Other features and aspects of the invention will become apparent by consideration of the detailed description and accompanying drawings. Any feature(s) described herein in relation to one aspect or embodiment may be combined with any other feature(s) described herein in relation to any other aspect or embodiment as appropriate and applicable.

Terms of degree such that "generally", "about", "substantially", or the like, are used, depending on context, to account for manufacture tolerance, degradation, trend, tendency, imperfect practical condition, etc. For example, when a value is modified by terms of degree such as "about", such expression includes the stated value ±15%, ±10%, ±5%, ±2%, or ±1%.

Unless otherwise specified, the terms "connected", "coupled", "mounted", or the like, are intended to encompass both direct and indirect connection, coupling, mounting, etc. Unless otherwise specified, the terms "layer", "film", and the like, are used broadly and are not intended to limit a structure to be strictly planar, strictly flat, and/or has even thickness.

BRIEF DESCRIPTION OF THE DRAWINGS

Embodiments of the invention will now be described, by way of example, with reference to the accompanying drawings in which.

DETAILED DESCRIPTION

Figure 1:
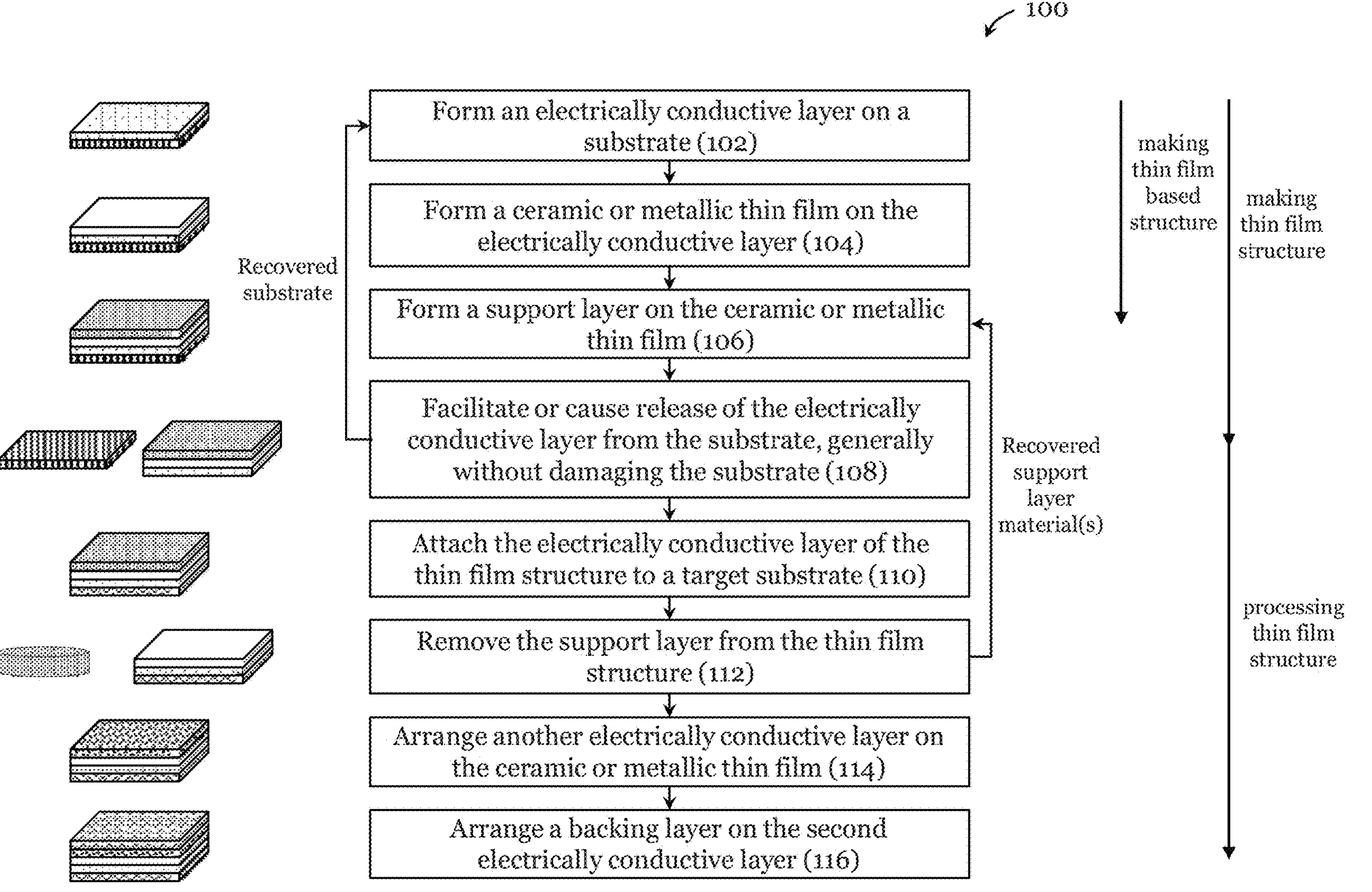
FIG. 1 is a flowchart illustrating a method for making and processing a thin film structure in one embodiment of the invention.

FIG. 1 shows a method 100 for making and processing a thin film structure in one embodiment of the invention.

In this embodiment, the method 100 begins in step 102, in which an electrically conductive layer is formed on a substrate. The electrically conductive layer is formed on the substrate and bonded weakly to the substrate by van der Waals interaction such that it is releasably attached to the substrate. The electrically conductive layer and the substrate are made with suitable material(s) such that when an interface between them contacts a water-based liquid, the water-based liquid facilitates or causes release of the electrically conductive layer from the substrate, substantially without damaging the substrate. In one example, the substrate is made of mica, e.g., one or more mica sheets. The electrically conductive layer is made of electrically conductive material(s) such as metallic material(s). In one example, the metallic material(s) include platinum. The forming in step 102 may be performed by depositing or coating the electrically conductive layer on the substrate, e.g., using magnetron sputtering technique. The water-based liquid can be any aqueous solution, including but not limited to water, optionally with surfactant(s).

After the electrically conductive layer is formed on a substrate, in step 104, a ceramic or metallic thin film is formed on the electrically conductive layer. The ceramic or metallic thin film can be made of one or more ceramic materials and/or one or more metallic materials, e.g., it may include a metallic layer made of one or more metallic materials (e.g., platinum, gold, silver). Or, it may include a ceramic layer made of one or more ceramic materials. In one example, the ceramic layer includes a piezoceramic layer made of one or more piezoceramic materials, such as sol-gel-derived ceramic material(s). The sol-gel-derived ceramic material may include BCZT ($Ba_{0.85}Ca_{0.15}Zr_{0.1}Ti_{0.9}O_3$), barium titanate (BTO) (e.g., $BaTiO_3$), lead zirconate titanate (PZT) (e.g., $Pb[Zr_xTi_{1-x}]O_3$ where 0:5≤x≤1), or any of their combination. Step 104 may include multiple sub-steps, including: (i) depositing a sol (a more liquid state of a colloidal solution) on the electrically conductive layer on the side opposite the substrate; (ii) converting the sol deposited on the electrically conductive layer into a gel (a more solid (solid or semi-solid) state of the colloidal solution); and (iii) crystalizing the gel to form a layer of thin film. The composition of the sol/gel will depend on the desired ceramic thin film. The depositing step (i) may include spin-coating the sol on the electrically conductive layer. The thickness of the sol deposited on the electrically conductive layer will depend on, e.g., spin speed of the spin-coating process, concentration of the sol, etc. In other words, these factors can be controlled to affect the thickness of the sol and hence the gel and the thin film layer. The converting in (ii) can be performed by drying (e.g., directly or indirectly applying heat to) the sol to form the gel. The crystalizing in (iii) may include annealing the gel to sinter it. The annealing may be include directly or indirectly heating or applying heat to the gel, e.g., heating the gel at an elevated temperature for a predetermined period of time to transform the gel into ceramic crystals or a ceramic crystal structure. Steps (i) to (iii) can be repeated (after the previous layer of thin film is formed) to form multiple such layers of thin film, one on top of another in the form of a stack. All layers of thin film formed (one or more, depending on whether (i) to (iii) are repeated) together provide the ceramic or metallic thin film formed in step 104.

After the ceramic or metallic thin film is formed, in step 106, a support layer is formed on the ceramic or metallic thin film on a side opposite the electrically conductive layer. The forming in step 106 may be performed by depositing or coating the support layer on the ceramic or metallic thin film. The support layer can be made of one or more polymer materials, such as ethylene-vinyl acetate (EVA), polyvinylidene fluoride (PVDF), polystyrene, poly(methyl methacrylate) (PMMA), etc., and it may be elastic. In one example, the forming includes spin-coating a polymer solution on the ceramic or metallic thin film to form the support layer. In this embodiment, the support layer (the material(s) forming it) can be chemically dissolved and/or thermally decomposed. The structure obtained in step 106 can be referred to as a thin film based structure, i.e., a structure based on a thin film, and itself is not necessarily a thin film.

To form a thin film structure from the thin film based structure obtained in step 106, in step 108, the substrate is released from the electrically conductive layer in such a way that the substrate is substantially undamaged. Specifically, step 108 includes contacting an interface between the substrate and the electrically conductive layer with a water-based liquid. The water-based liquid interacts with the interface to facilitate or cause release of the electrically conductive layer from the substrate, substantially without damaging the substrate. In some examples, step 108 includes causing (e.g., moving) the substrate and/or the electrically conductive layer to come into contact with the water-based liquid. Additionally or alternatively, step 108 may include causing (e.g., moving, directing, etc.) the water-based liquid to come into contact with the substrate and/or the electrically conductive layer. The release of the electrically conductive layer from the substrate may involve the electrically conductive layer moving relatively away from the substrate as the water-based solution penetrates the interface.

In some examples, the thin film structure obtained may have a thickness or average thickness in an order of microns. For example, the thin film structure may have a thickness or average thickness in a range of about 0.1 lam to about 5 μm. In some examples, the thin film structure may have a surface area in an order of square centimeters or square millimeters. For example, the thin film structure may have a surface area of about 2 cm×2 cm.

In step 108, the substrate released from thin film based structure is substantially undamaged. As a result, the substrate can be recovered and re-used for making another thin film based structure, e.g., based on steps 102 to 106.

The thin film structure obtained in step 108 can be further processed, e.g., to make a thin film based device. In this embodiment, the method 100 further includes step no, in which the thin film structure is transferred to another substrate, preferably a target substrate for a thin film based device. Specifically, step no includes attaching the electrically conductive layer of the thin film structure to a target substrate. In some examples the target substrate is made of electrically insulating material(s) such as polymer material (s). For example, the target substrate may be made of Polydimethylsiloxane (PDMS), polyethylene terephthalate (PET), polyimide (PI), etc. For example, the target substrate is flexible (e.g., stretchable, bendable, etc.). In one example, the electrically conductive layer of the thin film structure is attached or bonded to the target substrate using magnetron sputtering technique. In some examples, the electrically conductive layer of the thin film structure may be non-releasably attached or bonded to the target substrate. Preferably, the electrically conductive layer of the thin film structure may be attached or bonded to the target substrate more strongly than to the substrate.

After step no, the method 100 proceeds to step 112, in which the support layer is removed from the thin film structure. In this embodiment, the support layer (the material (s) forming it) can be chemically dissolved and/or thermally decomposed and so step 112 includes chemically dissolving and/or thermally decomposing the support layer. In some examples, the chemically dissolved and/or thermally decomposed support layer material(s) can be recovered and reused for forming the support layer of another thin film structure (in step **1*o*6**).

In step 114, the method 100 further includes arranging another electrically conductive layer on the ceramic or metallic thin film on a side opposite the first electrically conductive layer. The electrically conductive layer may or may not be chemically bonded to the ceramic or metallic thin film. With this arrangement, the ceramic or metallic thin film is arranged between and operably coupled with two electrically conductive layers. Together they form a flexible thin film based device. In this embodiment, the electrically conductive layer introduced in step 114 is made of electrically conductive material(s) such as metallic material(s). In one example, the metallic material(s) include platinum. The cross-sectional shape and/or size of the two electrically conductive layers may be of substantially the same or different. The two electrically conductive layers may be made of the same or different material(s). In one example, the two electrically conductive layers may operate as electrodes of a thin film based device.

After step 114, in step 116, the method 100 further includes arranging a backing layer on the electrically conductive layer formed in step 114 on a side opposite the ceramic or metallic thin film. The backing layer may or may not be chemically bonded to the electrically conductive layer formed in step 114. The backing layer, if it is arranged as an outermost layer of a device, can be considered as a cover layer. The backing layer can be made of electrically insulating material(s) such as polymer material(s). For example, the backing layer may be made of Polydimethylsiloxane (PDMS) and/or the backing layer is flexible (e.g., stretchable, bendable, etc.). The backing layer and the target substrate may be made of the same or different material(s). In some examples, the backing layer and the target substrate are both generally planar or flat, with the backing layer thinner than the target substrate.

The flexible thin film based device resulting from step 114 or 116 may be portable, wearable, etc., and may be stretchable, bendable, etc. In some examples, the ceramic or metallic thin film comprises a piezoceramic thin film, and the flexible thin film based device is a piezoelectric device operable as a piezoelectric sensor, a piezoelectric energy harvester (e.g., a piezoelectric generator or nanogenerator), etc.

The method 100 in this embodiment can be considered as a combination of different methods, including, e.g., a method for making thin film based structure, a method for making a thin film structure, a method for processing a thin film structure, etc. It should be appreciated that each of these different methods can be performed, partly or entirely, e.g., separately by different entities. It should also be appreciated that the method 100 can be modified to provide other methods in other embodiments. For example, step 106 may be omitted, step 112 may be omitted, step 116 may be omitted, extra step(s) may be included, etc. In one embodiment, if the ceramic or metallic thin film is a metallic thin film, step 102 may be omitted.

Some example implementations of the method 100 of FIG. 1 are provided in further detail below.

The inventors of the invention have realized, through research, experiments, and/or trials, that some existing methods for making ceramic thin films, such as those for use in flexible electronics, involve forming a thin film on a growth substrate and removing the thin film from the growth substrate, which typically involves physical laser lift-off or chemical etching, and as a result is complicated and costly. The inventors of the invention have devised a better way to make and process thin films structures (ceramics and/or metallic) suitable for use in, among other applications, flexible electronics.

Figure 2:
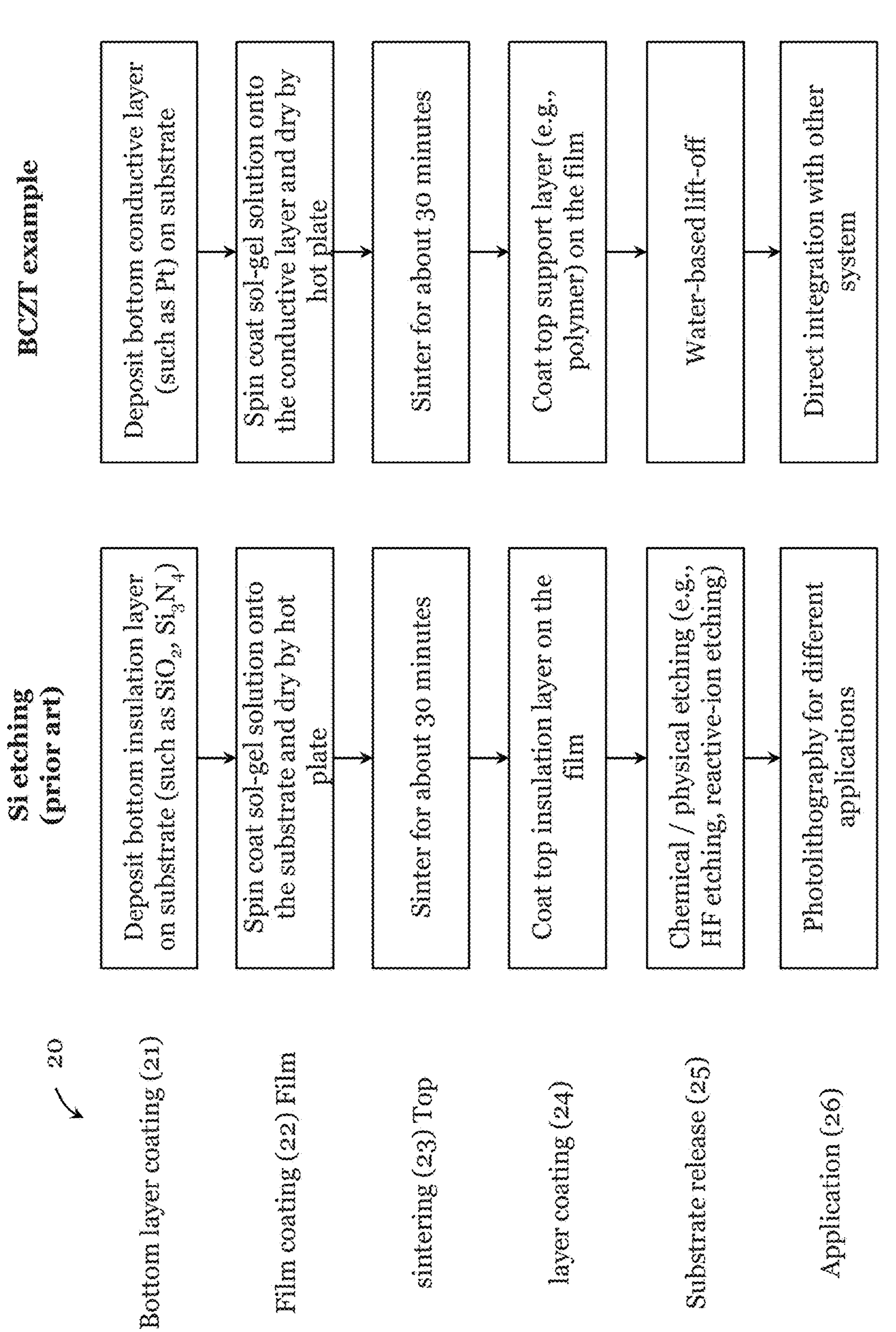
FIG. 2 is a flowchart comparing an existing thin film manufacturing method and a thin film manufacturing method in one embodiment of the invention.

FIG. 2 shows an existing thin film manufacturing method (Si etching) and a BCZT thin film manufacturing method in one embodiment of the invention, arranged side-by-side for easy comparison. The two methods generally include the following high-level operations: bottom layer coating operation 21, film coating operation 22, film sintering operation 23, top layer coating operation 24, substrate release operation 25, and application 26.

In the existing thin film manufacturing method, the bottom layer coating operation 21 includes depositing a bottom electrically insulation layer on a substrate. The substrate may be made of $SiO_2$, $Si_3N_4$, etc. In the existing thin film manufacturing method, the film coating operation 22 includes spin coating a sol-gel solution onto the substrate and then drying the spin-coated sol-gel solution using a hot plate. In the existing thin film manufacturing method, the film sintering operation 23 includes sintering the dried spin-coated sol-gel solution for about 30 minutes. In the existing thin film manufacturing method, the top layer coating operation 24 includes coating a top electrically insulation layer on the sintered thin film. In the existing thin film manufacturing method, the substrate release operation 25 includes physically or chemically etching (e.g., HF etching, reactive-ion etching) the substrate, which inevitably damages the substrate. In the existing thin film manufacturing method, the application 26 of the thin film structure (with substrate removed by etching) includes further processing the thin film structure using photolithograph techniques.

In the thin film manufacturing method of the embodiment of the invention, the bottom layer coating operation 21 includes depositing a conductive (e.g., metallic) layer (operable as an electrode layer, e.g., made of Pt) onto a substrate. In this embodiment, the substrate is a van der Waal's substrate such that the interaction between the metallic layer and the substrate is weak, e.g., weaker than other epitaxial growth materials. The substrate is configured to facilitate subsequent release of the substrate by a water lift-off process.

In the thin film manufacturing method of the embodiment of the invention, the film coating operation 22 includes preparing a 0.4M BCZT ($0.5Ba(Zr_{0.2}Ti_{0.8})O_3$-$0.5Ba_{0.7}Ca_{0.3}TiO_3$) sol solution using suitable amount and concentration of barium acetate (TCI), calcium acetate (TCI), zirconium isopropoxide (TCI, 70% in 1-proponol), and titanium isopropoxide (Alfa Aesar, 98%). In this example, the barium acetate is firstly dissolved in acetic acid in a first container with an appropriate amount of calcium acetate until the solid is fully dissolved. Titanium isopropoxide is then slowly added to an appropriate amount of zirconium isopropoxide in another container at room temperature, followed by adding the resulting solution into the first container in room temperature. Then, the two solutions are mixed at room temperature and diluted with 2-methoxyethanol (TCI) and distilled water to improve stability. The as-prepared sol solution is rested for at least 24 hours to ensure the chemical reactions are complete. Then the prepared BCZT sol solution is spin coated onto the metallic layer. The spin-coated thin layer of BCZT sol solution is then dried on a hot plate to convert to gel. The thickness of the gel layer is preferably arranged or controlled to prevent cracking during subsequent sintering. Preferably, the thickness of the/each gel layer is less than 500 nm.

In the thin film manufacturing method of the embodiment of the invention, the film sintering operation 23 includes crystallizing the gel to form a thin film. In this example, the thin film is sintered in a Muffle furnace at room temperature. The temperature is raised to the crystallization temperature of about 800 degree Celsius and maintained at the crystallization temperature for about 30 minutes. The furnace is cooled by air.

If a thicker film is required, the film coating operation 22 and the film sintering operation 23 can be repeated.

In the thin film manufacturing method of the embodiment of the invention, the top layer coating operation 24 includes a support layer coating operation. Specifically, in this example, before transferring the thin film structure (before releasing the thin film structure), a support polymer layer is coated onto the film surface. The selection of the polymer is determined by its mechanical properties, such as Young's modulus.

In the thin film manufacturing method of the embodiment of the invention, the substrate release operation 25 includes a water-based lift-off operation. Specifically, in this example, the thin film structure (electrode layer+BCZT thin film) can be lifted off or released from the substrate while water contacts and penetrates the interface between the thin film structure and the substrate.

In the thin film manufacturing method of the embodiment of the invention, the application 26 of the thin film structure includes directly applying it or integrating it with other system(s), device(s), or material(s). In some examples, properties characterizations can be performed on the thin film structure, and piezoelectric devices can be made based on the thin film structure. The freestanding (i.e., released from substrate) thin film structure can be transferred to a target substrate. For example, the thin film can be transferred to a substrate with electrode(s) to make an energy transducer.

In the thin film manufacturing method of the embodiment of the invention, the substrate is released from the thin film structure generally non-destructively and hence can be recovered and reused if needed.

The thin film manufacturing method of the above embodiment in FIG. 2 can be modified to provide other embodiments of the invention. For example, the substrate in operation 21 may have van der Waals interaction along the out-of-plane direction, and may be mica sheets. For example, the BCZT thin film can be other metallic and/or ceramic thin film. For example, the thin film structure for transfer to target substrate is preferably but not necessarily in the range of 0.1 μm to 5 μm. The thin film structure may have a cross sectional area in the order of centimeters square. For example, the substrate may have small interaction with the deposited metallic layer (film). For example, in operation 21, the bottom metallic layer, such as Pt, can be deposited via magnetron sputtering. For example, the crystallized piezoceramic thin film can be manufactured from the sol-gel solution, and the solution can remain stable at room temperature for half a year. For example, the piezoceramic thin film material can be any sol-gel derived ceramic material, such as but not limited to $Ba_{0.85}Ca_{0.15}Zr_{0.1}Ti_{0.9}O_3$. For example, in operation 22, the sol solution can be coated via spin coating method and the thickness of the sol solution hence the ultimate formed film can be adjusted by controlling the sol concentration and the spin-coating spin velocity. For example, in operation 22, the coated film is a BCZT sol-gel film, and it can be annealed at 800° C. for 30 minutes to crystallize. For example, in operation 24, the top support layer may be made of elastic polymer. For example, the polymer layer may be coated by spin-coating and then baked at 140° C. For example, the thin film structure can be lifted off from the substrate by the water front penetration between the interface of the van der Waals substrate and the metallic layer thereby releasing the thin film structure from the substrate. The water may lift off the thin film structure until the thin film structure completely separates from the substrate and floats on the water surface. For example, the thin film structure obtained after operation 25 can be transferred to a substrate of any shape and with developable surface. For example, the supporting polymer layer created in operation 24 can be subsequently removed by chemical dissolving or thermal decomposition, e.g., after transferring the film onto target substrates. For example, another metallic layer can be arranged on top of the thin film structure to operably coupled with it to form a piezoelectric sensor/energy harvester (the another metallic layer can serve as one electrode while the bottom metallic layer created in operation 21 can serve as the other electrode). In one example, the piezoelectric coefficient d33 of the BCZT thin film structure made is 209 pm/V.

Figure 3:
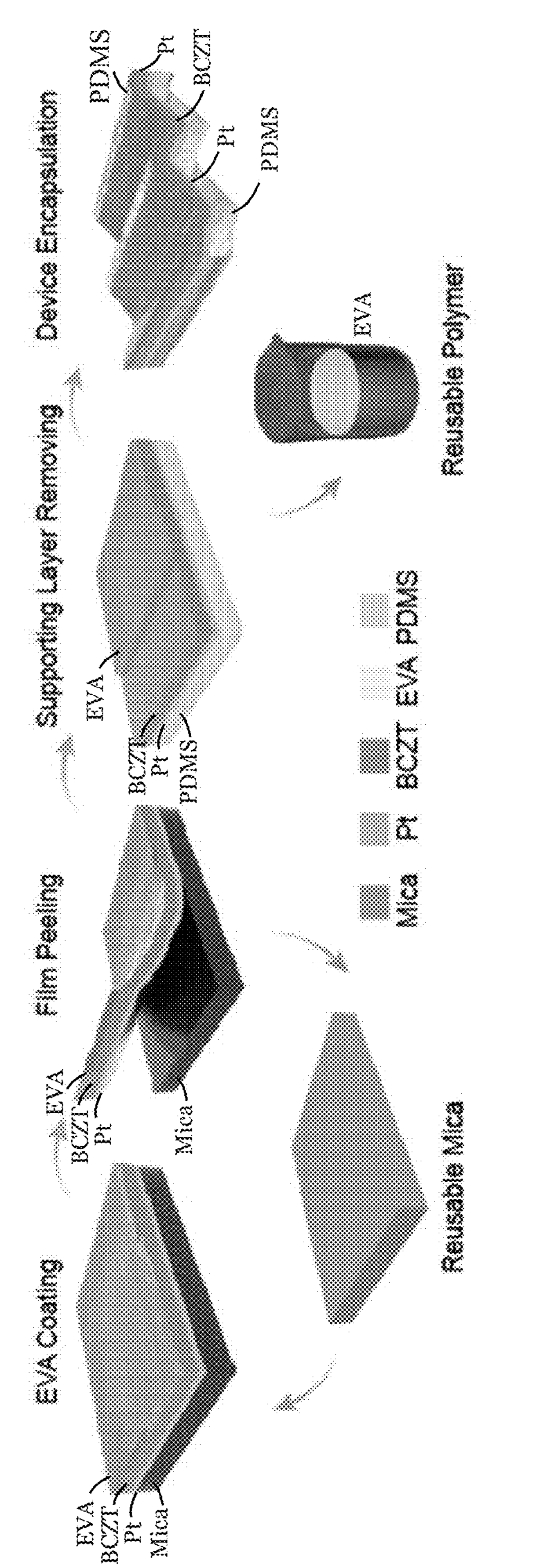
FIG. 3 is a schematic diagram illustrating a thin film based device manufacturing method in one embodiment of the invention.

FIG. 3 illustrates a thin film based device manufacturing method in one embodiment of the invention. The method 300 can be considered as an illustration of the embodiment of FIG. 2. The freestanding BCZT thin film structure obtain after operation 25 can be used for making flexible electronic device. As mentioned, the process starts from film growth and ends with device encapsulation. When the BCZT thin film structure is successfully transferred to the target substrate, the EVA support layer can be removed with toluene. In this embodiment the dissolved EVA can be recovered and reused in the method for coating onto another surface of another thin film structure. In this embodiment the support layer material and the substrate can both be recovered and reused. This facilitates low-cost production of the thin film structure and hence the associated device (e.g., flexible electronic devices).

Figure 4:
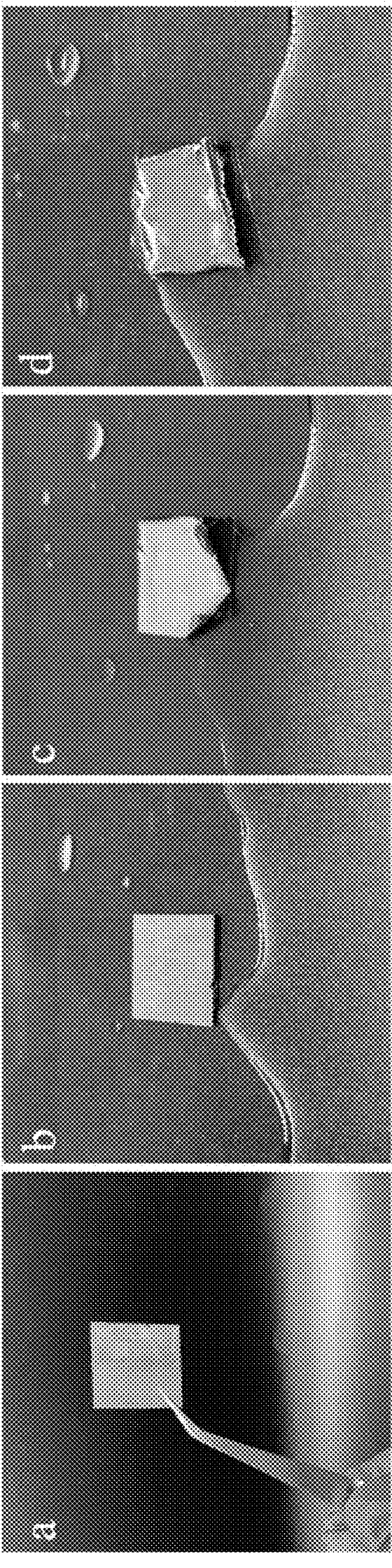
FIG. 4 is a series of photographs illustrating a water lift-off process in a metallic thin film structure manufacturing method in one embodiment of the invention.

FIG. 4 shows a water lift-off process of a freestanding metallic thin film structure in one embodiment. In this example, a metal, platinum, is firstly deposited onto the mica substrate and the EVA is coated onto the surface of the metal. Then the waterfront penetrates the interface of the metal and the substrate, the film lifts off from the substrate and float onto the water. FIG. 4, in (a), shows that one corner of the metal film is peeled off by the waterfront. FIG. 4, in (b), shows the initiation of the water lift-off. FIG. 4, in (c), shows that the water peels off two corners of the metal film. FIG. 4, in (d), shows that the film is lifted off from the substrate and floats on the water surface.

Figure 5:
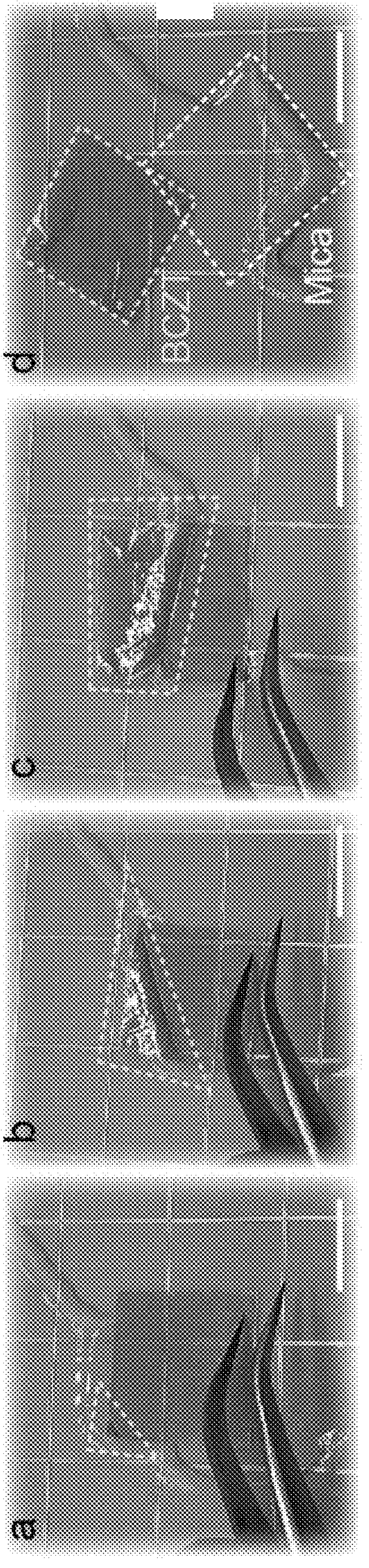
FIG. 5 is a series of photographs illustrating a water lift-off process in a ceramic (BCZT) thin film structure manufacturing method in one embodiment of the invention.

FIG. 5 shows a water lift-off process of a freestanding BCZT thin film structure (bottom Pt layer+BCZT thin film) in one embodiment. This freestanding BCZT thin film structure is generally the same as the one described above. In FIG. 5, (a), one corner of the BCZT thin film structure is peeled off by the water front. Generally, the corner is in contact with the water interface and it will take a few seconds for the water to soak into the interface between Pt and mica. In FIG. 5, (b), a larger area of the film is peeled off with the water advancing. In FIG. 5, (c), about a half of the film is peeled off by water penetration. In FIG. 5, (d), the thin film structure is lifted off from the substrate and floats on the water surface. Finally, the mica substrate will remain at the bottom of the water. Since the upper surface of the thin film structure is hydrophobic while the bottom surface of the thin film structure is hydrophilic, the lift-off thin film structure can float on the water and supported by the surface tension without any substantial wrinkles.

Figure 6:
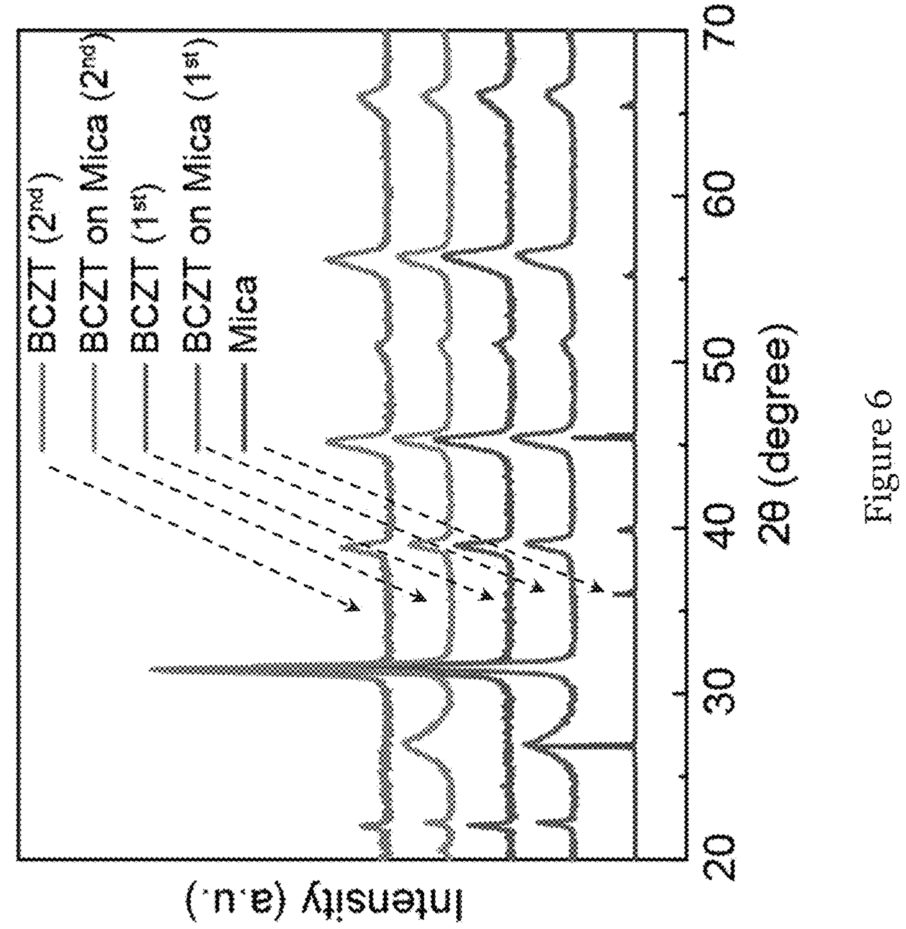
FIG. 6 is a graph showing XRD patterns of a substrate (mica), a BCZT thin film structure formed on the substrate (mica), the corresponding freestanding (separated from substrate) BCZT thin film structure, another BCZT thin film structure formed on the substrate (mica, reused), and the other corresponding freestanding (separated from substrate) BCZT thin film structure in one embodiment of the invention.

FIG. 6 shows XRD patterns of a substrate (mica), the BCZT thin film structure formed on the substrate (mica), the corresponding freestanding (separated from substrate) BCZT thin film structure, another BCZT thin film structure formed on the substrate (mica, reused), and the other corresponding freestanding (separated from substrate) BCZT thin film structure in the above embodiment of the invention. As seen in FIG. 6, the (100) and (110) peaks are obvious in in all cases with the BCZT thin film structure. This indicates that the BCZT thin film structure are grown or formed properly.

Figure 7:
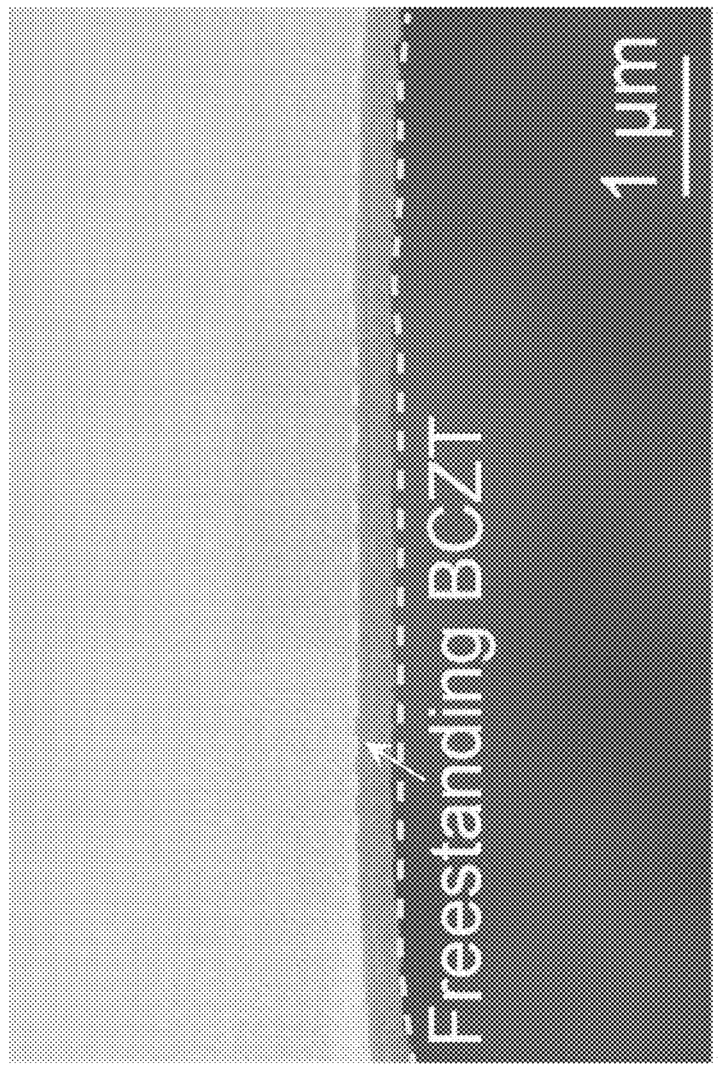
FIG. 7 is a cross-sectional scanning electron microscope image of the freestanding (separated from substrate) BCZT thin film structure in one embodiment of the invention.

FIG. 7 shows the cross-sectional scanning electron microscope image of the freestanding BCZT thin film structure. In this example, the thickness of the BCZT thin film structure is about 400 nm, and the grain size of the BCZT thin film structure is about 100 nm.

Figure 8:
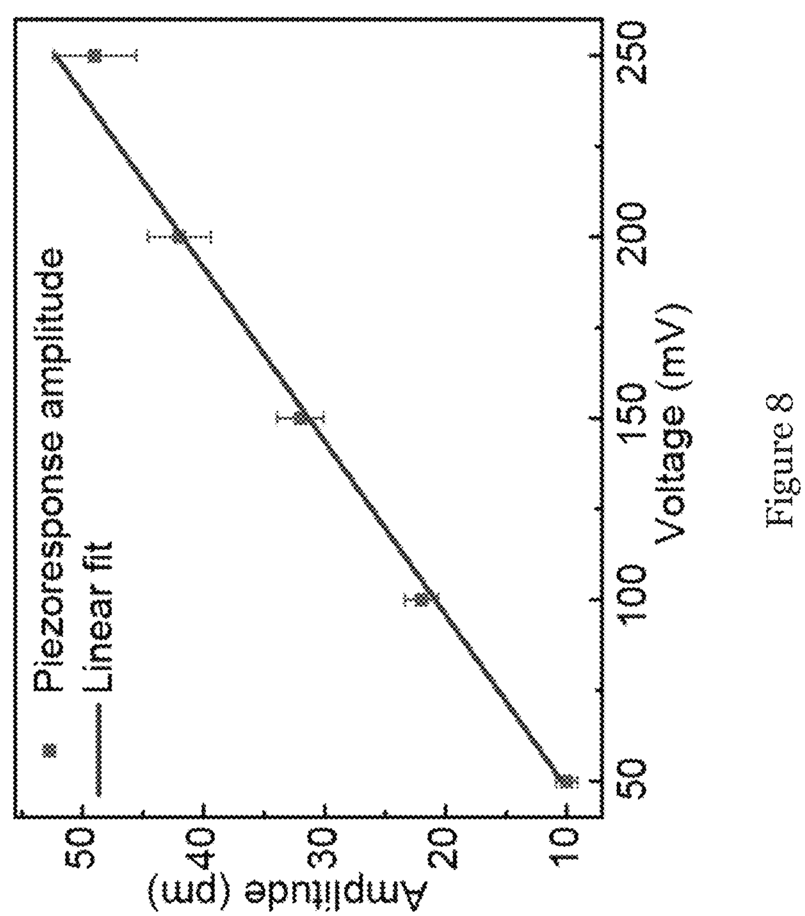
FIG. 8 is a graph showing piezoelectric coefficient of the freestanding BCZT thin film structure in one embodiment of the invention determined using a piezoresponse force microscope.

FIG. 8 shows piezoelectric coefficient of the freestanding BCZT thin film structure in one embodiment of the invention determined in an experiment using a piezoresponse force microscope. In this experiment a driven voltage ranging from 50 mV to 25*o* mV is separately applied to detect the response amplitude. The piezoelectric response of the BCZT thin film structure shows a generally linear relationship with the increasingly driving voltage. The piezoelectric coefficient d33 in this example is 209±10 pm/V, as calculated based on the slope of the straight line linearly fitting from the data.

Figure 9:
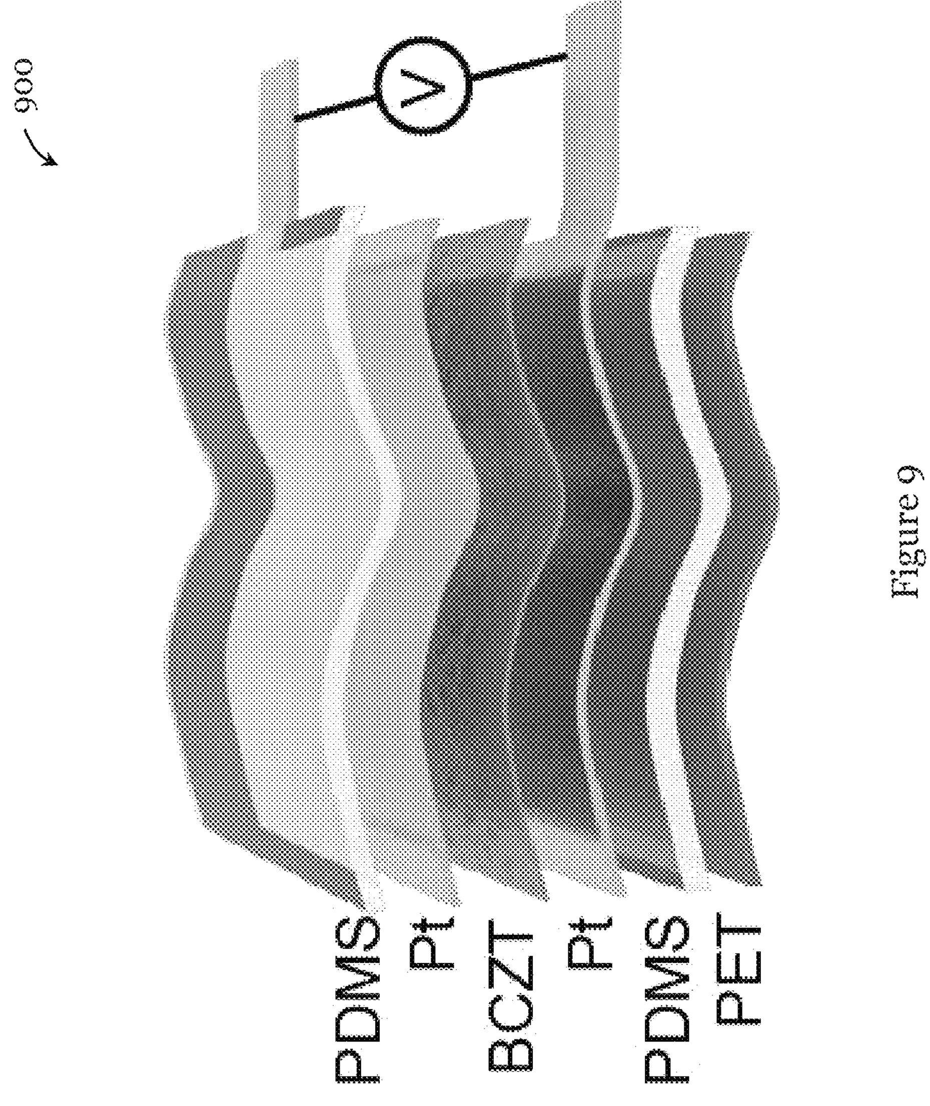
FIG. 9 is a schematic diagram illustrating a flexible freestanding BCZT thin film structure based piezoelectric nanogenerator in one embodiment of the invention.

FIG. 9 illustrates a piezoelectric nanogenerator 900 in one embodiment of the invention. The piezoelectric nanogenerator 900 is made using the BCZT thin film structure in the above embodiments. Generally, the BCZT thin film structure (Pt electrode layer+BCZT thin film) is arranged with another Pt electrode layer on another side of the BCZT thin film and are disposed between (e.g., encapsulated by) top and bottom substrate layers. The top substrate layer is a polydimethylsiloxane (PDMS) layer. The bottom substrate layer includes a polydimethylsiloxane (PDMS) layer and a polyethylene terephthalate (PET) layer. In this example, the thickness of the bottom PDMS layer is larger than the top PDMS layer to reduce the influence of the neutral layer/surface on the piezoelectric properties.

Figure 10B:
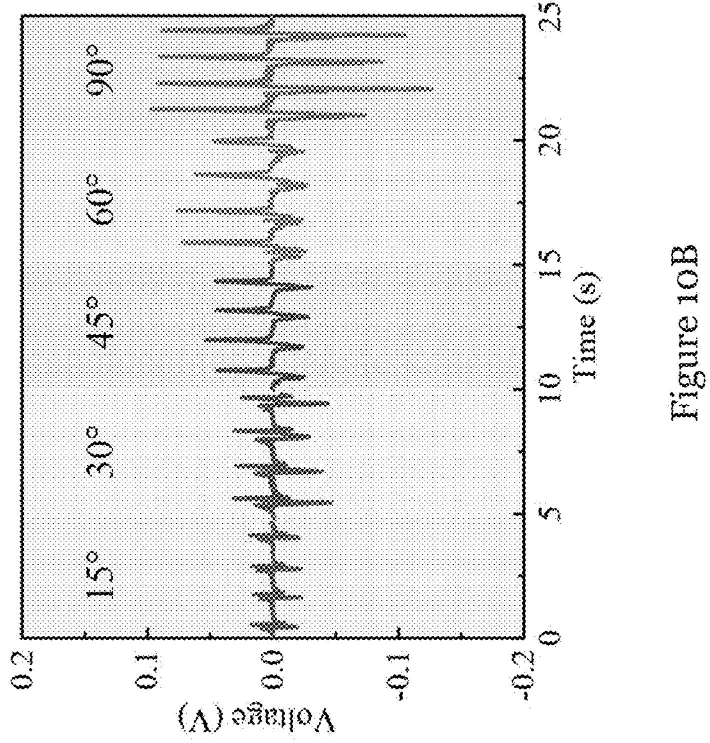
FIG. 10B is a graph showing different voltage outputs of the piezoelectric nanogenerator of FIG. 9 obtained by manually bending the piezoelectric nanogenerator at different extents of bending.
Figure 10A:
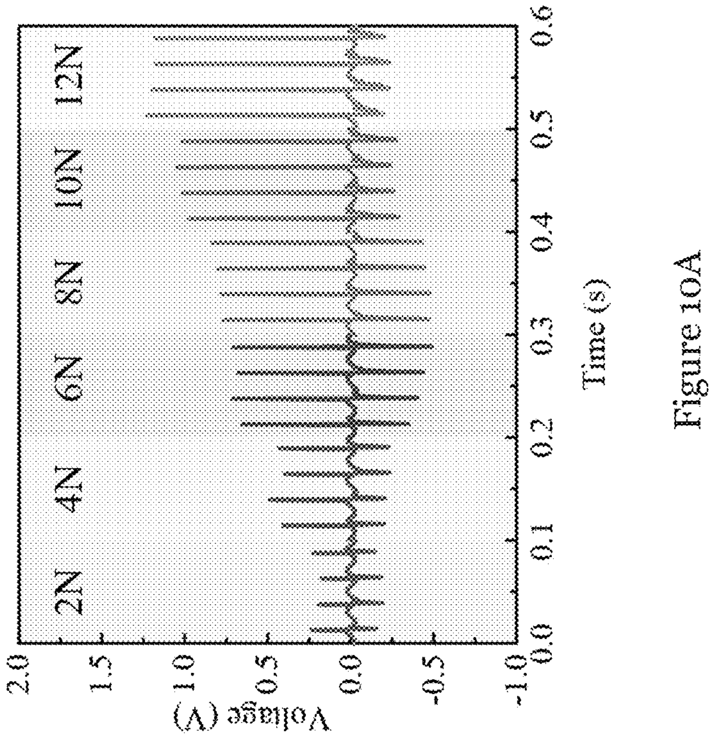
FIG. 10A is a graph showing different voltage outputs of the piezoelectric nanogenerator of FIG. 9 obtained by pressing the top surface of the piezoelectric nanogenerator relative to the bottom surface using different forces.

FIG. 10A shows different voltage outputs of the piezoelectric nanogenerator 900 obtained by pressing (generally periodically) the top surface of the piezoelectric nanogenerator 900 relative to the bottom surface (while bottom surface remains generally stationary) with different forces. The output of the piezoelectric nanogenerator 900 shows a generally linear relationship with the increase of the pressing force. When the force reaches 12 N, the voltage output reaches 1.3 V.

FIG. 10B shows different voltage outputs of the piezoelectric nanogenerator 900 obtained by manual bending (generally periodically) of the piezoelectric nanogenerator 900 at different extents (bent by hand). In this example the bending angle is determined by the tangent angle formed by both sides of the piezoelectric nanogenerator 900 relative to a bending apex of the piezoelectric nanogenerator 900. The voltage output of the piezoelectric nanogenerator 900 generally linearly increases from 20 mV to 120 mV under a bending stimulus that increased from 15° to 90° at generally the same rate.

The above embodiments of the invention have provided, among other things, a method for making and processing freestanding metal thin film structure, a method for making and processing freestanding piezoceramic thin film structure, and the resulting thin film structures and related devices. The freestanding thin film structures in some embodiments can be integrated into flexible electronic devices. The thin film structures in some embodiments can be used in various industries including, e.g., piezoelectric materials, ultrasound, sensors, actuators, energy harvesters, acoustic transducers, robots, etc.

Some embodiments of the invention may have one or more of the following advantages. Some embodiments of the invention may have additional or alternative advantages not specially described here. For example, in some embodiments, the ceramic thin film structure can be lifted off from the rigid substrate to exhibit high flexibility. For example, in some embodiments, the freestanding thin film structure can be transferred onto any substrates for flexible electronic applications. For example, in some embodiments, the thin film transfer process is green (environmentally friendly) and cost effective as it will generally not destroy the composition of the substrate and/or the support layer material. For example, in some embodiments, the thin film structure can provide a piezoelectric parameter that reaches 209 pm/V, which is quite remarkable for some applications. For example, in some embodiments, the method has high generality and can be applied to obtain other freestanding metal or ceramic material thin film structures not specifically illustrated.

It will be appreciated by persons skilled in the art that numerous variations and/or modifications may be made to the invention as shown in the specific embodiments to provide other embodiments of the invention. The described embodiments of the invention should therefore be considered in all respects as illustrative, not restrictive. Example optional features of some aspects of the invention are set forth in the summary section above. Some embodiments of the invention may include one or more of these optional features (some of which are not specifically illustrated in the drawings). Some embodiments of the invention may lack one or more of these optional features (some of which are not specifically illustrated in the drawings). One or more features in one embodiment and one or more features in another embodiment may be combined to provide further embodiment(s) of the invention. While some of the above embodiments specifically refer to a piezoceramic thin film (as the "ceramic or metallic thin film") and related device, it should be appreciated that the invention can be more broadly applied to ceramic or metallic thin film and related device.

The invention claimed is:

1. A method of making a thin film based structure, the method comprising steps of:

forming an electrically conductive layer on a substrate such that the electrically conductive layer is releasably attached to the substrate;

forming a thin film on the electrically conductive layer, on a side opposite the substrate, wherein, the thin film comprises comprising a ceramic thin film or a metallic thin film;

forming a support layer on the thin film, on a side opposite the electrically conductive layer; and contacting an interface between the substrate and the electrically conductive layer with a water-based liquid to facilitate release of the electrically conductive layer from the substrate, substantially without damaging the substrate, thereby forming the thin film base structure.

2. The method of claim 1, wherein the substrate is made of mica.

3. The method of claim 1, wherein the electrically conductive layer comprises a metallic layer.

4. The method of claim 1, wherein the step of forming the electrically conductive layer on the substrate comprises depositing or coating the electrically conductive layer on the substrate.

5. The method of claim 4, wherein the depositing or coating is performed by using magnetron sputtering technique.

6. The method of claim 1, wherein the thin film comprises a ceramic layer made of one or more ceramic materials.

7. The method of claim 6, wherein the ceramic layer comprises a piezoceramic layer; and wherein the one or more ceramic materials comprise one or more piezoceramic materials.

8. The method of claim 7, wherein the one or more piezoceramic materials comprise a sol-gel-derived ceramic material.

9. The method of claim 8, wherein the sol-gel-derived ceramic material comprises at least one of $Ba_{0.85}Ca_{0.15}Zr_{0.1}Ti_{0.9}O_3$, barium titanate, or lead zirconate titanate.

10. The method of claim 1, wherein (b) the step of forming the thin film on the electrically conductive layer comprises:

depositing a sol on the electrically conductive layer, on the side opposite the substrate;

converting the sol deposited on the electrically conductive layer into a gel; and crystalizing the gel to form a layer of thin film;

wherein the thin film comprises the layer of thin film.

11. The method of claim 10, wherein the depositing the sol on the electrically conductive layer comprises spin-coating the sol on the electrically conductive layer, on the side opposite the substrate.

12. The method of claim 11, wherein the converting the sol deposited on the electrically conductive layer into the gel comprises drying the sol to form the gel and the crystalizing the gel comprises annealing the gel to sinter the gel.

13. The method of claim 12, wherein (b) the step of forming the thin film on the electrically conductive layer comprises:

repeating the depositing the sol on the electrically conductive layer, the converting the sol deposited on the electrically conductive layer into the gel, and the crystalizing the gel at least once to form at least two layers of thin film on the electrically conductive layer, the at least two layers of thin film comprises the layer of thin film;

wherein the thin film comprises the at least two layers of thin film.

14. The method of claim 1, wherein the step of forming the support layer on the thin film comprises:

depositing or coating the support layer on the thin film.

15. The method of claim 14, wherein the depositing or coating the support layer comprises spin-coating a polymer solution on the thin film to form the support layer.

16. The method of claim 1, wherein the step of contacting the interface between the substrate and the electrically conductive layer with the water-based liquid comprises:

moving at least one of the substrate or the electrically conductive layer to come into contact with the water-based liquid; or moving the water-based liquid to come into contact with at least one of the substrate or the electrically conductive layer.

17. The method of claim 1, wherein the support layer is an elastic polymer material that can be chemically dissolved or thermally decomposed.

18. The method of claim 1, further comprises a step of:

reusing the substrate to form a second thin film structure, wherein the step of reusing the substrate to form the second film structure comprises:

forming a second electrically conductive layer on the substrate such that the second electrically conductive layer is releasably attached to the substrate;

forming a second thin film on the second electrically conductive layer, on a side opposite the substrate, the second thin film comprising a ceramic thin film or a metallic thin film;

forming a second support layer on the second thin film, on a side opposite the second electrically conductive layer; and contacting an interface between the substrate and the second electrically conductive layer with a second water-based liquid to facilitate release of the second electrically conductive layer from the substrate, substantially without damaging the substrate, thereby forming the second thin film structure.

* * * * *